(12) United States Patent
Gettemy et al.

(10) Patent No.: US 9,084,363 B2
(45) Date of Patent: Jul. 14, 2015

(54) COMPACT DISPLAY FLEX AND DRIVER SUB-ASSEMBLIES

(75) Inventors: Shawn Robert Gettemy, San Jose, CA (US); Wei Yao, Fremont, CA (US); Barry Corlett, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 90 days.

(21) Appl. No.: 13/006,937

(22) Filed: Jan. 14, 2011

(65) Prior Publication Data

US 2011/0110054 A1     May 12, 2011

Related U.S. Application Data

(63) Continuation of application No. 11/650,133, filed on Jan. 5, 2007, now Pat. No. 7,940,365.

(51) Int. Cl.
*G02F 1/1345* (2006.01)
*H05K 1/14* (2006.01)
*H05K 1/18* (2006.01)

(52) U.S. Cl.
CPC .............. *H05K 1/147* (2013.01); *G02F 1/1345* (2013.01); *H05K 1/181* (2013.01); *H05K 2201/09145* (2013.01); *H05K 2201/09227* (2013.01); *H05K 2201/10674* (2013.01); *Y10T 29/4913* (2015.01)

(58) Field of Classification Search
CPC .............. G02F 1/1345; G02F 1/13452; G02F 1/13454; G02F 1/13458

USPC .................................................. 349/149–152
See application file for complete search history.

(56) References Cited

U.S. PATENT DOCUMENTS

| | | | |
|---|---|---|---|
| 5,450,222 A | 9/1995 | Sirkin | |
| 7,292,289 B2 * | 11/2007 | Nagahama | 349/58 |
| 7,411,287 B2 * | 8/2008 | Ding | 257/692 |
| 7,522,145 B2 | 4/2009 | Lee et al. | |
| 7,940,365 B2 | 5/2011 | Gettemy et al. | |
| 2003/0043104 A1 * | 3/2003 | Lee et al. | 345/92 |
| 2003/0103184 A1 * | 6/2003 | Nishino | 349/149 |
| 2006/0238450 A1 * | 10/2006 | Onodera | 345/60 |
| 2007/0081117 A1 * | 4/2007 | Liu et al. | 349/150 |

* cited by examiner

*Primary Examiner* — Dung Nguyen

(57) ABSTRACT

Compact sub-assemblies of flexible circuits and drivers are provided. The sub-assemblies can occupy less space in an electronic device than conventional sub-assemblies. In one or more embodiments of the present invention, the flexible circuits can be attached to or wires can be disposed on portions of the substrate that previously were unoccupied in conventional sub-assemblies. In one or more embodiments, the sub-assemblies of the present invention also can have wires disposed underneath the driver or vary the width of the wires. In one or more embodiments, the sub-assemblies of the present invention also can have composite wires that occupy less space than wires of conventional sub-assemblies, while still maintaining similar energy flux.

15 Claims, 10 Drawing Sheets

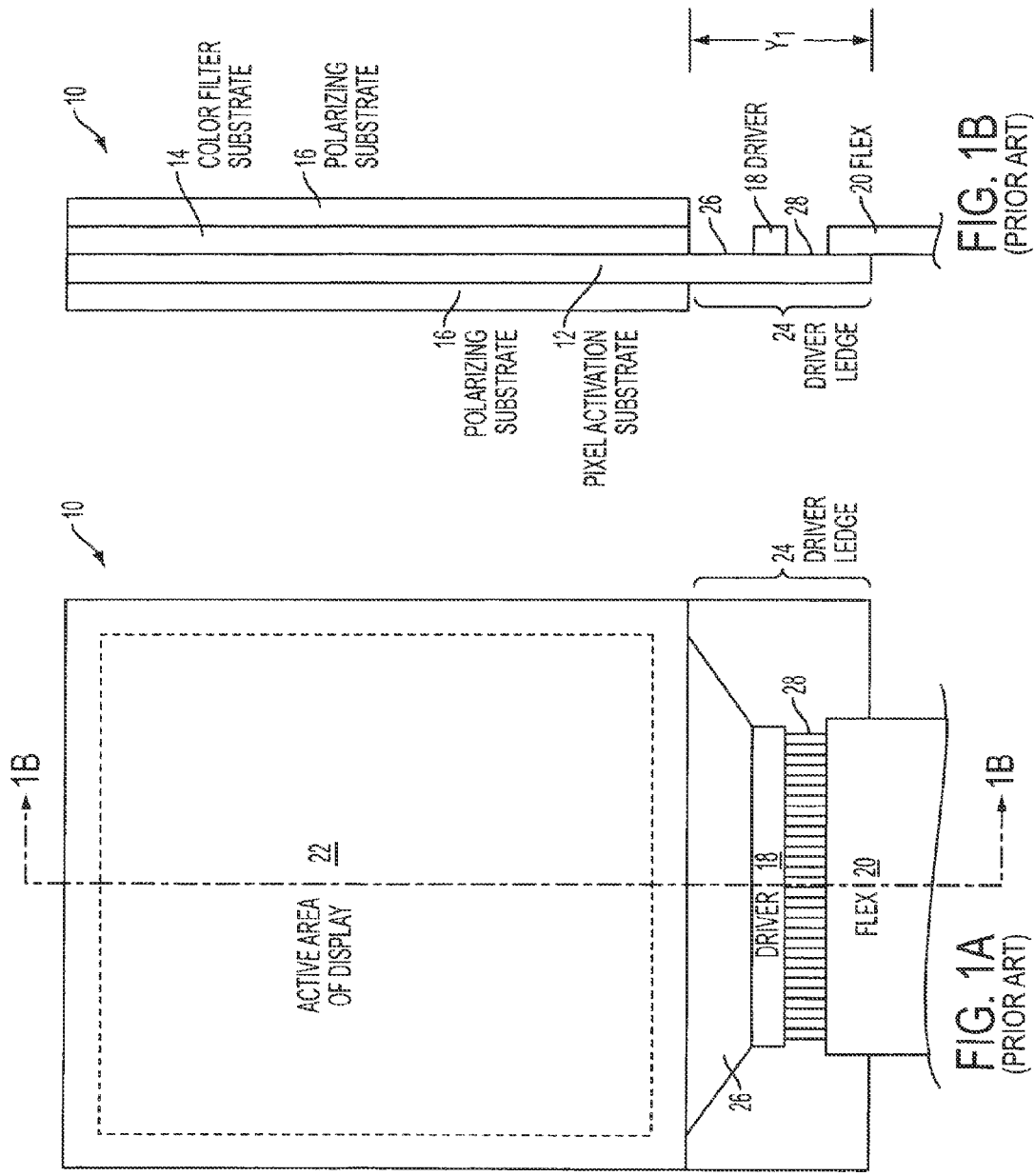

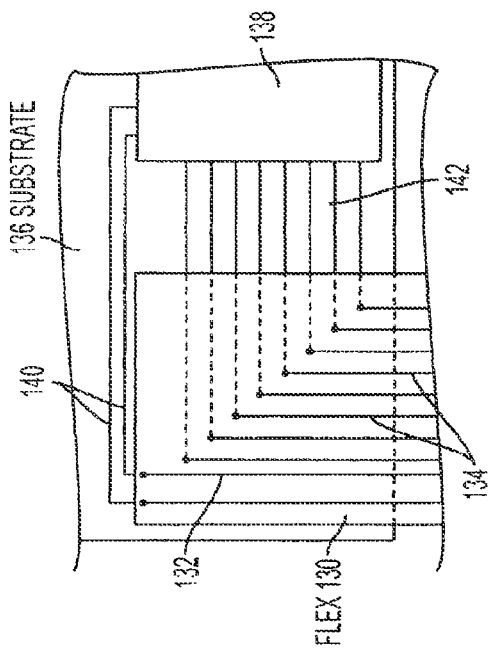
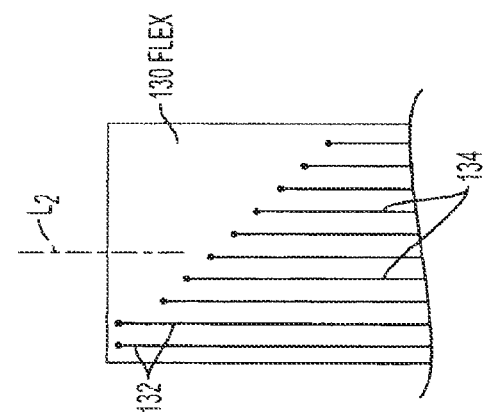
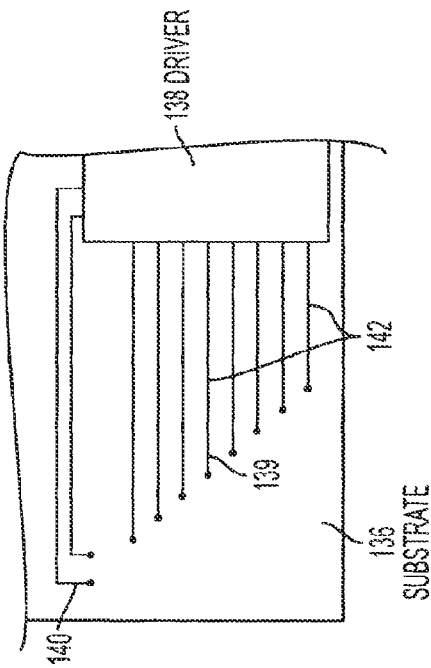

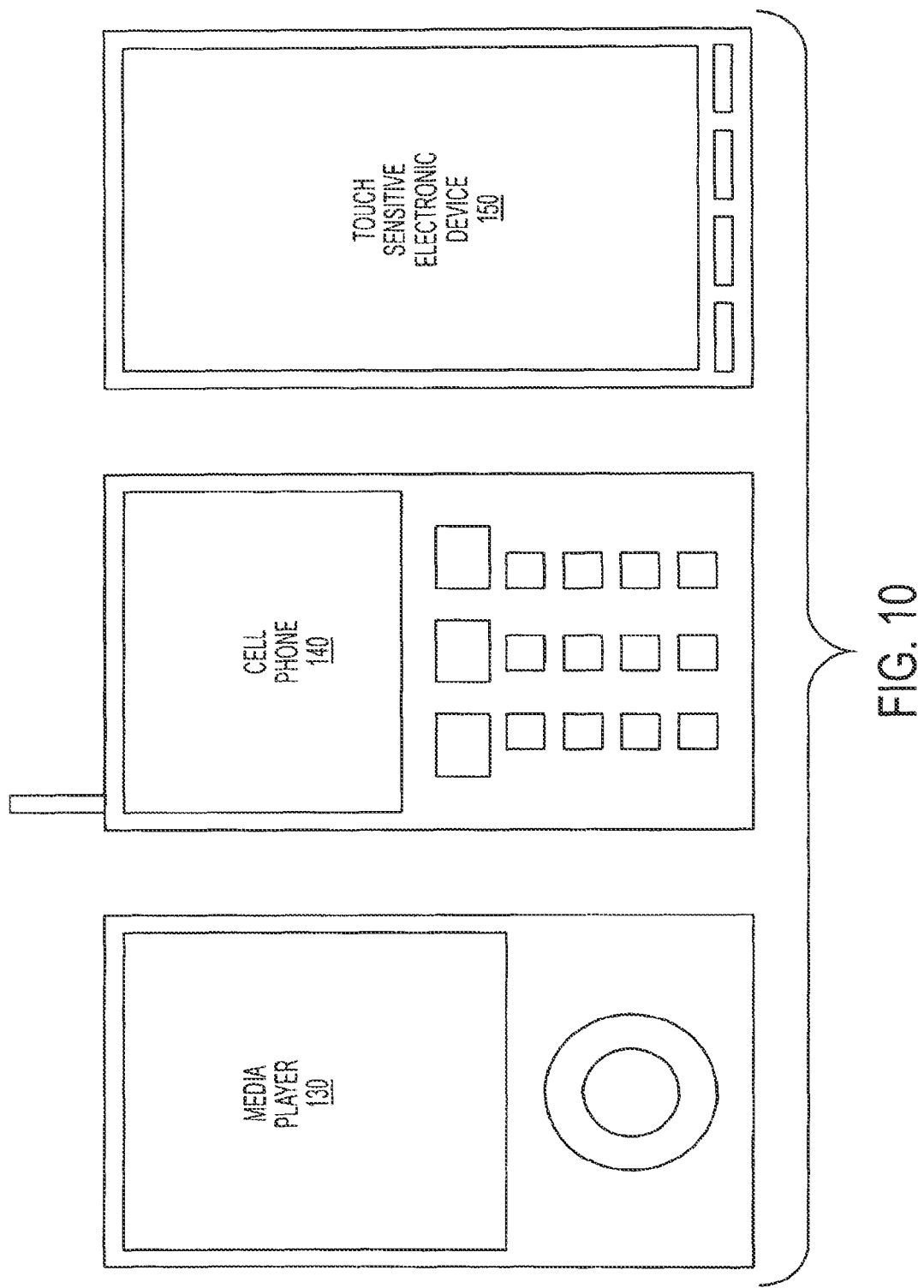

COMPACT DISPLAY FLEX AND DRIVER SUB-ASSEMBLIES

CROSS REFERENCE TO RELATED APPLICATION

This application is a continuation of U.S. patent application Ser. No. 11/650,133, filed on Jan. 5, 2007, now allowed, which is hereby incorporated by reference herein in its entirety.

FIELD OF THE INVENTION

The present invention relates to compact flexible circuit and driver sub-assemblies for an electronic device.

BACKGROUND OF THE INVENTION

Many currently available electronic devices have displays that provide graphics to the user. To drive pixels of the display, a conventional display assembly can incorporate a display driver operatively coupled via wires to a flexible circuit. The flexible circuit (also referred to herein as a "flex") can be operatively coupled to a circuit board of the electronic device using, e.g., board-to-board connectors. The circuit board can have a controller for generating signals that instruct the display driver to selectively drive pixels of the display.

Consumers are demanding increasingly smaller electronic devices with increasingly larger displays. Consequently, space within the devices has become increasingly limited. In particular, the size of the electronic device and display can be limited, in part, by the space occupied by the display driver, the flex, and the wires that operatively couple the two components.

SUMMARY OF THE INVENTION

The present invention can include compact flex and driver sub-assemblies for an electronic device. The compact sub-assemblies can reduce the amount of space occupied by the flex, the driver, and the wires that operatively couple the two components.

In one or more embodiments of the present invention, this can be accomplished by providing a flex with one or more attachment portions that attach to previously unused areas on a substrate on which the driver is disposed. This can reduce or eliminate the areas of the substrate to which the flex used to be attached in conventional designs. For example, in conventional display assemblies, some areas of the substrate disposed laterally adjacent to the driver may not be occupied by other components. Thus, the flex can be attached to those areas of the substrate. Wires can be disposed in a multi-dimensional (e.g., 2-D or 3-D) pattern on the substrate to operatively couple the driver to portion(s) of the flex attached to the substrate.

In one or more embodiments of the present invention, the space within the electronic device occupied by the flex and driver sub-assembly can be reduced by reducing the maximum width of the flex to be less than that of the driver. To evenly distribute and balance the signal lines across the entire width of the driver, one or more of the wires that operatively couple the flex to the driver can be run underneath the driver. Thus, at least one wire can be disposed in an area of the substrate on which the driver also is to be disposed, directly or indirectly.

Another embodiment of the present invention can include staggered wire layouts that facilitate coupling of a flex to a substrate when the wires on both components are not co-linearly disposed with each other at or near the regions in which the two components are attached.

Another embodiment of the present invention also can include sub-assemblies having wires with widths that vary from wire to wire, and/or that vary along the same wire. This can permit a wire to be tailored for specific impedance levels, while accommodating the limited surface area on which the wires can be disposed.

Another embodiment of the present invention also can include composite wires that deliver similar energy flux as multiple wires in conventional sub-assemblies, but that occupy less space. This can permit the flex to have a narrower width and/or for the wires to occupy less space on the substrate.

BRIEF DESCRIPTION OF THE DRAWINGS

The above and other advantages of the present invention will be apparent upon consideration of the following detailed description, taken in conjunction with accompanying drawings, in which like reference characters refer to like parts throughout, and in which:

FIGS. 1A-1B show a prior art display assembly having a flex and driver sub-assembly;

FIGS. 7A-7C illustrate a staggered wire pattern in accordance with one embodiment of the present invention;

FIG. 10 shows illustrative electronic devices in which flex and driver sub-assemblies of the present invention can be incorporated.

DETAILED DESCRIPTION OF THE INVENTION

Figure 2A:
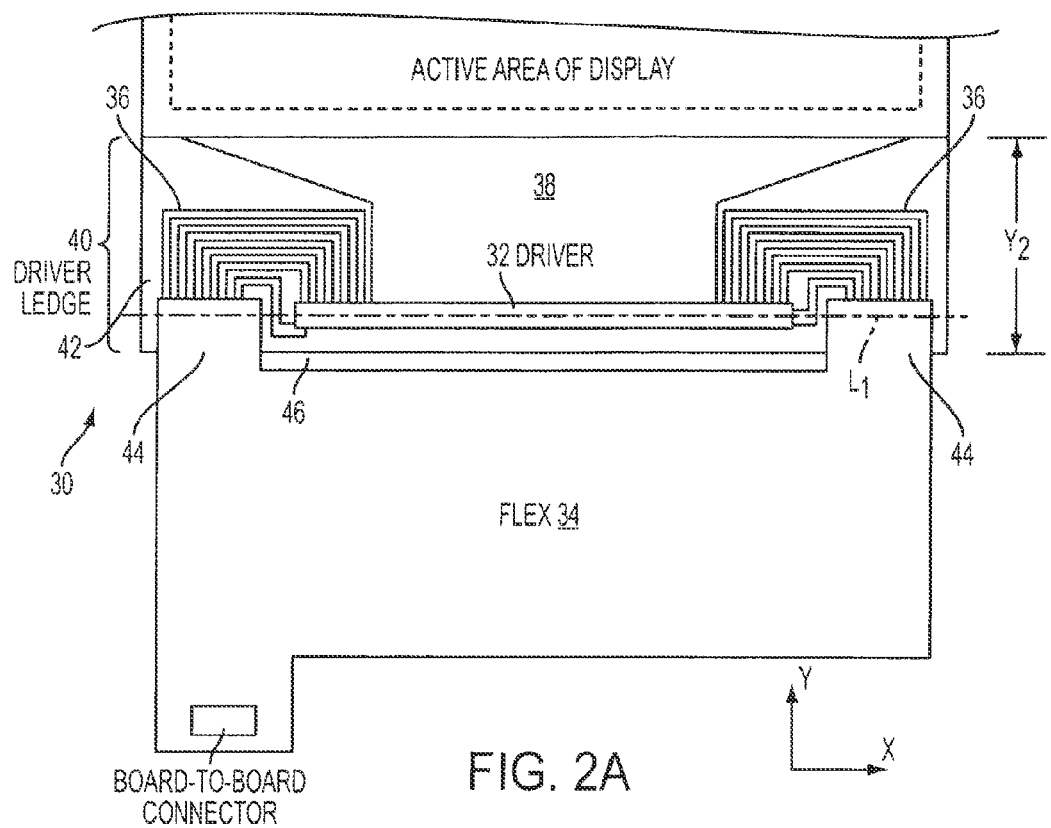
FIGS. 2A-2B illustrate a compact flex and driver sub-assembly in accordance with a first embodiment of the present invention.

FIGS. 1A-1B show a prior art display assembly having a flex and driver sub-assembly. Display assembly 10 can include pixel activation substrate 12, color filter substrate 14, polarizing substrates 16, driver 18, and flex 20. Pixel activation components and color filters can be interposed between substrates 12 and 14. Color filter substrate 14 can be disposed on top of pixel activation substrate 12. Polarizing substrates 16 can sandwich pixel activation substrate 12 and color filter substrate 14 therebetween. These stacking arrangements are merely illustrative.

Pixel activation components can include components that energize and/or define one or more pixels in the display. For example, in active liquid crystal displays, pixel activation components can include a matrix of thin film transistors that can energize liquid crystals in the display. The area in which the pixel activation components are disposed can define active area 22 of the display in which graphics can be provided to users. Display assembly 10 also can include pixel active components for other types of display technologies, e.g., passive liquid crystal displays, plasma displays, organic light emitting diode displays, surface-conduction electron emitter displays, or any other type of display technology known in the art or otherwise.

In conventional display assembly 10, pixel activation substrate 12 can have driver ledge 24 on which display driver 18 and flex 20 are disposed, directly or indirectly. To drive pixel activation components of display assembly 10, display driver 18 can be operatively coupled to the pixel activation components via driver-to-active area fan-out 26. Fan-out 26 can include a set of wires disposed on pixel activation substrate 12, directly or indirectly. Display driver 18 can be driven by signals transmitted through flex 20, which can be operatively coupled to driver 18 using flex-to-driver fan-out 28. Fan-out 28 also can include a set of wires disposed on pixel activation substrate 12, directly or indirectly. Flex 20, in turn, can be operatively coupled to a circuit board (not shown) that generates signals for instructing driver 18 to selectively drive pixels of the display.

In conventional flex and driver sub-assemblies, flex 20 and driver 18 can communicate using parallel signal transmission. The width of the portion of flex 20 attached to driver ledge 24 typically can be greater than or substantially equal to the width of driver 18 to permit flex-to-driver fan-out 28 to have a sufficient number of wires for parallel signal transmission. In conventional display assembly 10, the length, cross-sectional area, and material of all, the wires of flex-to-driver fan-out 28 are substantially uniform so that each wire in fan-out 28 has substantially the same nominal impedance. The nominal impedance can be based on the maximum specified impedance for the signals transmitted between driver 18 and flex 20.

The conventional design illustrated in FIGS. 1A-1B can suffer some disadvantages. First, driver ledge 24 can have areas that are not occupied by any components of the flex-to-driver sub-assembly. This can be an inefficient use of space. Second, due to the configuration of flex-to-driver fan-out 28 and the consequent width of flex 20, the flex can occupy a lot of space within the electronic device. Unfortunately, as electronic devices become smaller and displays become larger, the space occupied by display driver 18, flex 20, and flex-to-driver fan-out 28 can limit the small size of the electronic device and/or the size of the display.

In one or more embodiments, the present invention can reduce the amount of space occupied by driver 18, flex 20, and flex-to-driver fan-out 28 and provide compact flex and driver sub-assemblies for electronic devices generally.

Figure 2B:
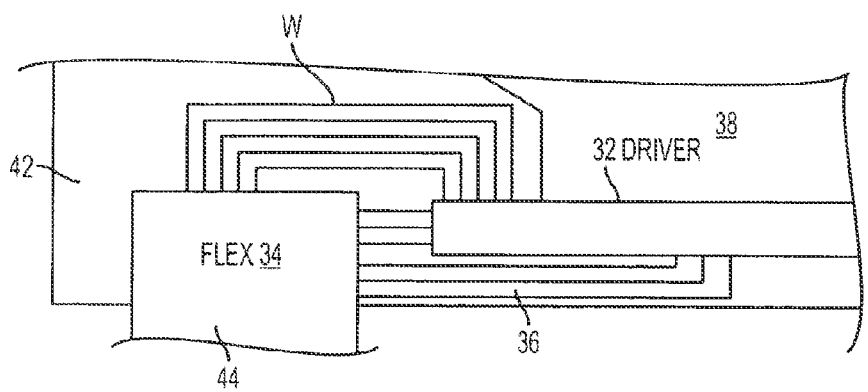

FIGS. 2A-2B illustrate a compact flex and driver sub-assembly in accordance with a first embodiment of the present invention. Sub-assembly 30 can include driver 32, flex 34, flex-to-driver fan-out 36, and driver-to-active area fan-out 38, all of which can be disposed (at least in part) on driver ledge 40 of pixel activation substrate 42, directly or indirectly. In one embodiment of the present invention, substrate 42 can be made of transparent, non-conductive material, e.g., glass.

To reduce the Y dimension of the driver ledge so that length $Y_2$ of ledge 40 is less than length $Y_1$ of ledge 24 of FIG. 1, the space on driver ledge 42 occupied by portions of flex 20 and fan-out 28 in conventional display assembly 10 can be reduced or eliminated. This can be accomplished by attaching multiple smaller attachment portions 44 of flex 34 to areas of substrate 42 that were unused in conventional display assembly 10, instead of attaching the flex to the pixel activation substrate along the entire width of the flex as in FIG. 1. For example, in conventional display assembly 10 of FIG. 1, unused areas of substrate 12 can be located laterally adjacent to driver 18 in the X-axis, e.g., in-line with longitudinal axis L1 of display driver 18. To efficiently use this space, attachment portions 44 of flex 34 can be disposed on substrate 42 in those previously unoccupied areas, e.g., so that attachment portions 44 intersect longitudinal axis L1 of driver 32. As a result, flex 34 can form recess 46 between attachment portions 44 within which driver 32 can be disposed.

Wires of flex-to-driver fan-out 36 can emanate from a single edge of each attachment portion 44 (as in FIG. 2A) or from multiple edges of each attachment portion 44 (as in FIG. 2B). In the latter case, the wires in attachment portion 44 and fan-out 36 can terminate in staggered configurations, as described in greater detail below with respect to FIGS. 7A-7C. The wires also can terminate along one or more edges of display driver 32. Unlike the fan-out of conventional display assemblies in which all the wires are disposed in one-dimensional patterns, one or more wires of fan-out 36 can be configured in a multi-dimensional (e.g., 2-D or 3-D) pattern. Advantageously, the flexibility in the configuration of the wires of flex-to-driver fan-out 36 can permit the flex and display driver sub-assemblies to be designed more compactly.

As used herein, when a wire is disposed in a one-dimensional pattern, that wire has a linear configuration. That is, the wire is disposed on the substrate along one linear axis. When a wire is disposed in a 2-D pattern, the wire has a non-linear configuration. For example, as shown in FIG. 2B, wire W is disposed on substrate 42 along both orthogonal X and Y axes. A wire also can be disposed in a 2-D pattern when it is disposed in two or more non-orthogonal directions. Likewise, a wire also can be disposed in a non-linear 3-D pattern.

Again, to efficiently use areas of the substrate that previously was unoccupied in conventional flex and driver sub-assemblies, portions of flex-to-driver fan-out 36 may be disposed in the same lateral space in the X-axis as driver-to-active area fan-out 38. For example, in the illustrative embodiment shown in FIGS. 2A-2B, no intervening components are disposed between the two fan-outs. Depending on the layout, the area occupied by driver-to-active area fan-out 38 and the configuration of wires in fan-out 38 may need to be adjusted to accommodate flex-to-driver fan-out 36.

Because some of the wires of fan-out 36 have greater length than that of the wires of conventional flex-to-driver fan-outs, the longer wire-traces of fan-out 36 also may have greater impedance. To reduce the likelihood that the impedances of the wires of flex-to-driver fan-out 36 do not surpass the maximum specified impedance of the signals transmitted therethrough, one or more of the wires can have a greater cross-sectional area than that of conventional flex-to-driver fan-outs. More detailed discussion of this can be found below with respect to FIG. 8. To accommodate the greater cross-sectional area of one or more of the wires, flex-to-driver fan-out 36 can have a fewer number of wires as compared to that of fan-out 28 of conventional display assembly 10. To transmit the same number and type of signals with fewer wires, the electronic device may employ a high speed serial interface, such as, for example, the Mobile Pixel Link physical layer offered by National Semiconductor Corporation of Santa Clara, Calif., the Mobile Display Digital Interface offered by Qualcomm Incorporated of San Diego, Calif., and the Mobile Industry Processor Interface (MIPI) promulgated by the MIPI Alliance. To further reduce the likelihood that the impedances of the wires of flex-to-driver fan-out 36 do not surpass the maximum specified impedance of the signals transmitted therethrough, the signals can be prioritized so that those requiring lower impedance wires can be transmitted through the wires having shorter length and/or larger cross-sectional area.

Pixel activation substrate 42 can include additional features to facilitate alignment of flex 34 and driver 32. For example, to align flex 34, an optical registration camera (not shown) can be placed underneath substrate 42 and used to provide feedback as to the alignment of one or more registration marks on the substrate with one or more registration marks on the flex. Similarly, to align driver 32, the optical registration camera can provide feedback as to the alignment of one or more registration marks on the substrate with one or more registration marks on the driver. The optical registration camera also can be used to provide feedback as to the alignment of wires on the flex with those of fan-out 36, and/or the alignment of electrical contacts of driver 32 with the wires of fan-out 36.

Figure 3:
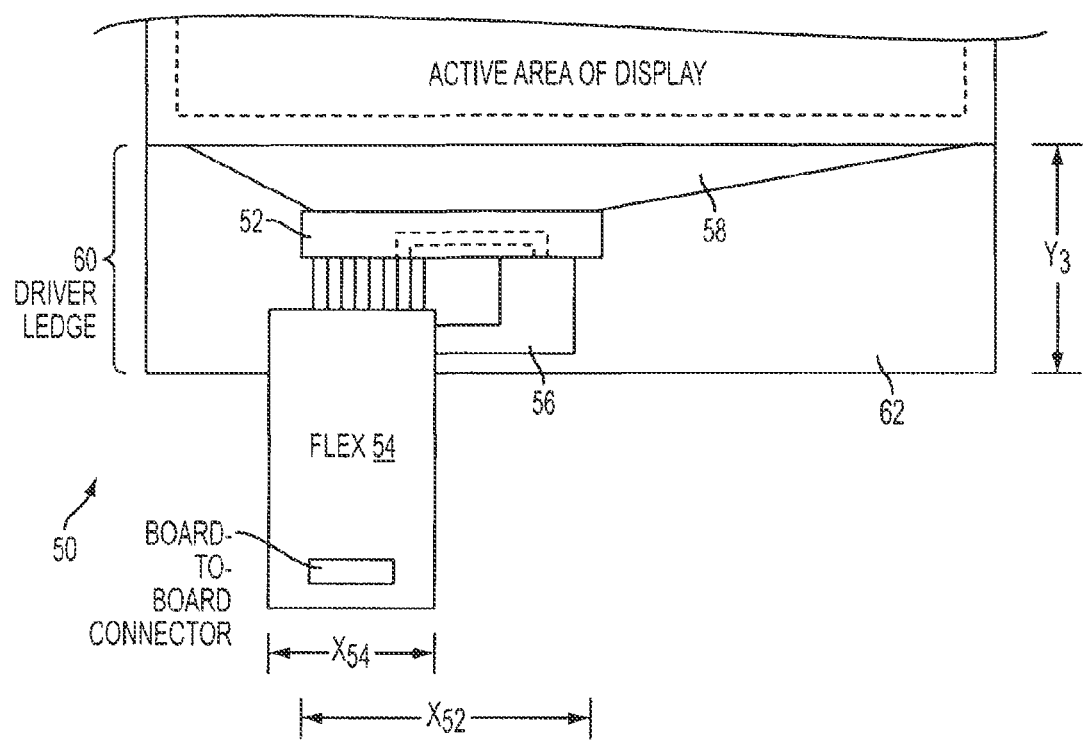
FIG. 3 illustrates a compact flex and driver sub-assembly in accordance with a second embodiment of the present invention.

FIG. 3 illustrates a compact flex and driver sub-assembly in accordance with a second embodiment of the present invention. Flex and driver sub-assembly 50 can include driver 52, flex 54, flex-to-driver fan-out 56, and driver-to-active area fan-out 58, all of which can be disposed (at least in part) on driver ledge 60 of pixel activation substrate 62, directly or indirectly.

To reduce the space within the electronic device that is occupied by flex 54, flex 54 can have a maximum width that is less than that of flex 20 of FIG. 1 and driver 52 (i.e., maximum width $X_{54}$ of flex 54 can be less than width $X_{52}$ of driver 52). Because flex 54 has a smaller width, the area of flex 54 that can be attached to pixel activation substrate 62 also can be smaller. As a result, flex 54 may not be able to accommodate as many wires. Again, a high speed serial interface may be employed to permit all desired signals to be transmitted using fewer wires. Composite wires, such as those described below with respect to FIGS. 9B-9D, also can be used to accommodate the reduction in the number of wires. Also, to reduce the likelihood that the impedances of the wires of flex-to-driver fan-out 56 do not surpass the maximum specified impedance of the signals transmitted therethrough, the wires of fan-out 56 can have an increased cross-sectional area and signals can be prioritized so that those requiring lower impedance wires can be transmitted through the wires having shorter length and/or greater cross-sectional area.

As with flex-to-driver fan-out 36 of FIGS. 2A-2B, the wires of flex-to-driver fan-out 56 can emanate from a single edge of flex 54 or from multiple edges of flex 54. Some wires of fan-out 56 can have the same uniform length and be disposed in a parallel one-dimensional pattern between driver 52 and flex 54. These wires can transmit, for example, signals that require transmission along lower impedance lines. Other wires can have non-uniform lengths and be disposed in 2-D patterns. These wires can transmit, for example, signals that permit transmission through higher impedance lines. Again, the flexibility in the configuration of the wires of flex-to-driver fan-out 56 can permit flex and driver sub-assemblies to be designed to be more compact.

To reduce the Y dimension of the driver ledge so that length $Y_3$ of ledge 60 is less than length $Y_1$ of ledge 24 of FIG. 1, one or more wires of flex-to-driver fan-out 56 can be routed underneath display driver 52 when the driver is disposed on substrate 62. Thus, at least one wire trace is disposed in an area of the substrate on which display driver 52 is to be disposed, rather than occupying additional space on substrate 62 in the X-Y plane. Depending on the height of the wires of fan-out 56, the wires disposed underneath driver 52 may not appreciably increase the height by which the driver is offset from substrate 62. Wires routed underneath driver 52 can transmit any type of power and data signals, so long as the resistance of the wires do not exceed the maximum impedance for which the signals are specified. In one embodiment of the present invention, wires routed underneath the driver can transmit power signals and/or serve as a ground potential.

Figure 4:
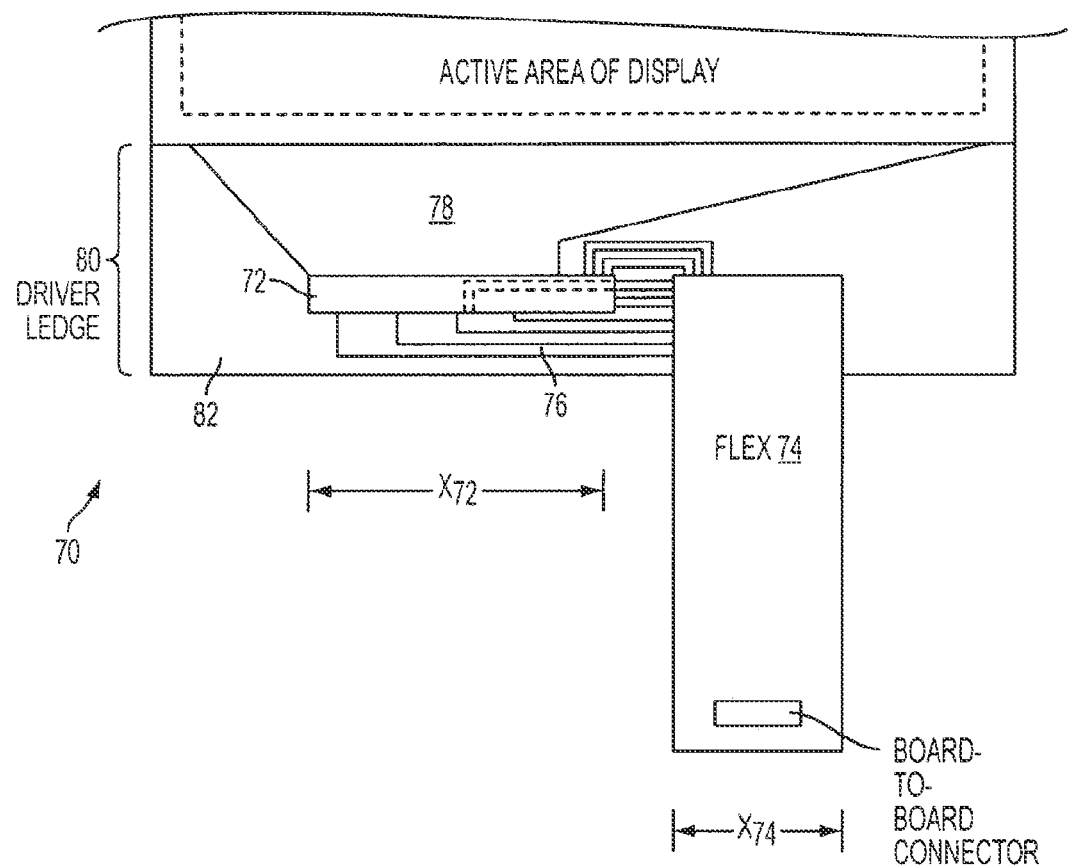
FIG. 4 illustrates a compact flex and driver sub-assembly in accordance with a third embodiment of the present invention.

FIG. 4 illustrates a compact flex and driver sub-assembly in accordance with a third embodiment of the present invention. Flex and driver sub-assembly 70 can include driver 72, flex 74, flex-to-driver fan-out 76, and driver-to-active area fan-out 78 disposed on driver ledge 80 of pixel activation substrate 82, directly or indirectly.

Sub-assembly 70 can be a combination of sub-assemblies 30 and 50. For example, flex 74 can have maximum width $X_{74}$ that is less than width $X_{72}$ of driver 72. Because flex 74 is narrower, the attachment portion of flex 74 for attaching the flex to substrate 82 also may be smaller. This can permit flex 74 to be attached to previously unused portions of substrate 82. For example, flex 74 can be attached to substrate 72 so that the flex intersects the longitudinal axis of driver 72.

Flex-to-driver fan-out 76 also can be configured similarly to those of sub-assemblies 30 and 50. Flex-to-driver fan-out 76 can have wires that emanate from one or multiple edges of flex 74. The wires also can terminate along one or multiple edges of display driver 72. One or more wires of fan-out 76 also can be disposed on substrate 82 in the same area on which display driver 72 is disposed. That is, wires can be disposed on substrate 82 underneath display driver 72. To accommodate signals that require transmission along lower impedance lines, some wires of fan-out 76 can have the same uniform length and be disposed in parallel one-dimensional patterns between driver 72 and flex 74. Fan-out 76 also can have one or more wires that are disposed in two-dimensional patterns. One or more two-dimensional wires in flex-to-driver fan-out 76 can be disposed adjacent to driver-to-active area fan-out 78 in the X-axis.

Figure 5:
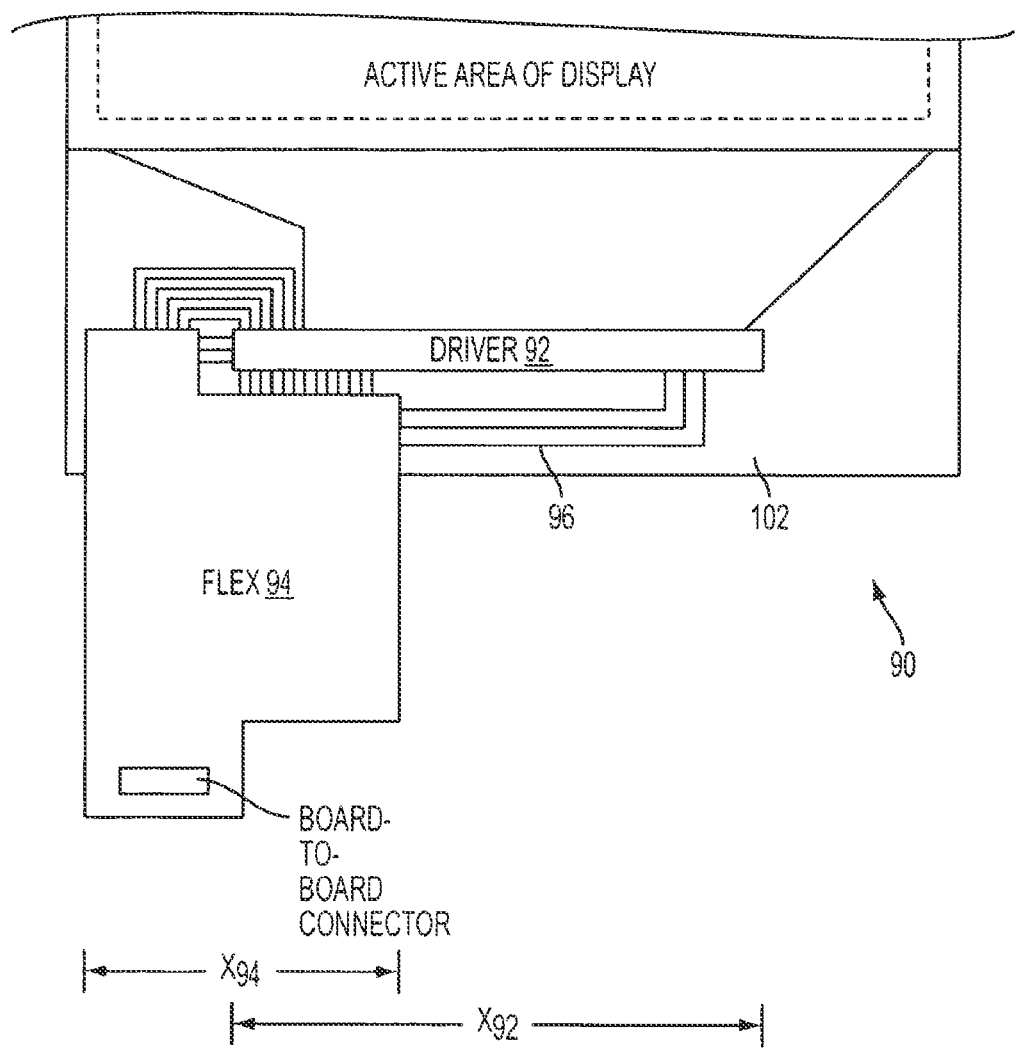
FIG. 5 illustrates a compact flex and driver sub-assembly in accordance with a fourth embodiment of the present invention.

FIG. 5 illustrates a compact flex and driver sub-assembly in accordance with a fourth embodiment of the present invention. Flex and driver sub-assembly 90 can be similar to sub-assembly 70 of FIG. 4 except that maximum width $X_{94}$ of flex 94 attached to substrate 102 can be greater than that of flex 72, while still being less than width $X_{92}$ of display driver 92. The added width can permit flex-to-driver fan-out 96 to incorporate additional wires for transmission of signals between driver 92 and flex 94. This can permit an electronic device incorporating sub-assembly 90 to employ either a parallel or serial data transmission interface as desired. Furthermore, the additional wires can have shorter length and be disposed in parallel one-dimensional patterns between the display driver and the flex. This can permit fan-out 96 to accommodate more signals requiring transmission through lower impedance lines.

Figure 6:
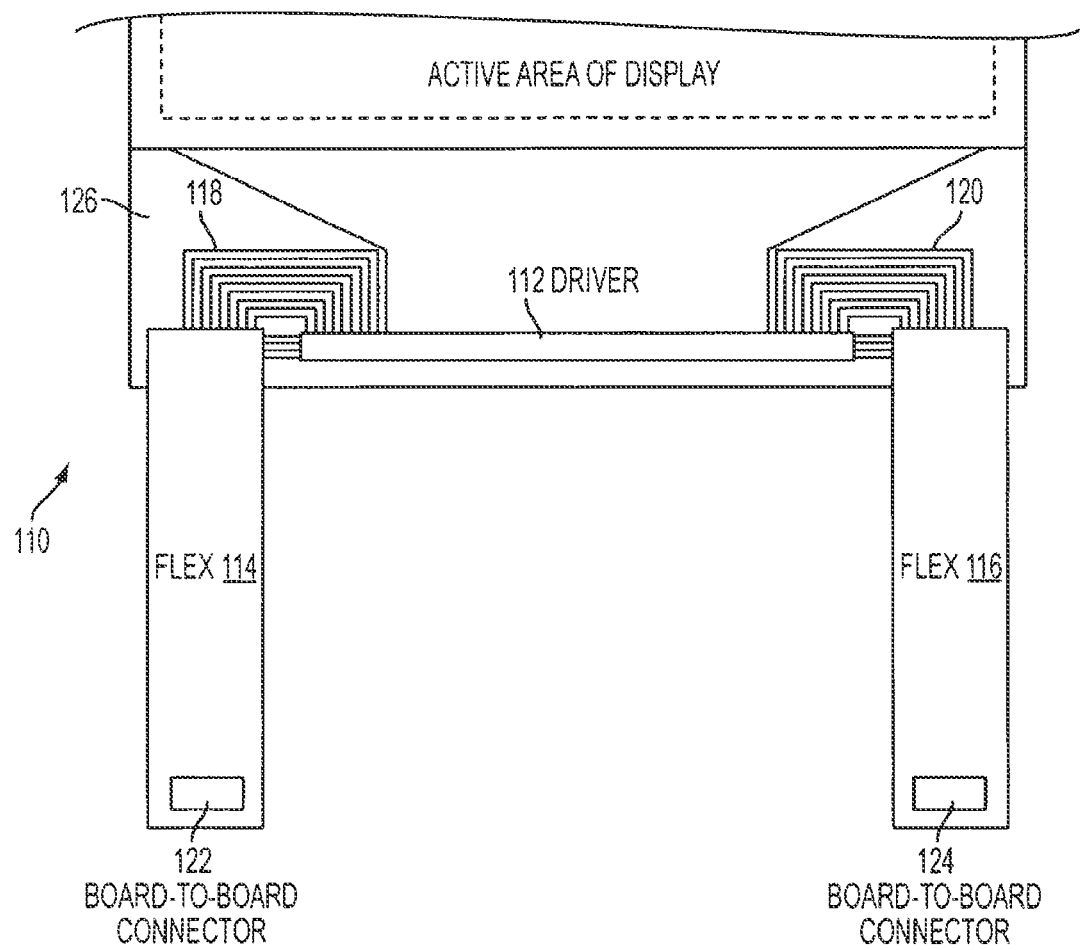
FIG. 6 illustrates a compact flex and driver sub-assembly in accordance with a fifth embodiment of the present invention.

FIG. 6 illustrates a compact flex and driver sub-assembly in accordance with a fifth embodiment of the present invention. Flex and driver sub-assembly 110 can be similar to sub-assembly 30 of FIGS. 2A-2B except that the mid-span of flex 34 can be eliminated to reduce the space occupied by the flex. Accordingly, sub-assembly 110 can have two flexes 114 and 116, each of which can be attached to substrate 126 at previously unoccupied areas of the substrate. Flex-to-driver fan-outs 118, 120 can be disposed on substrate 126 (directly or indirectly) to operatively couple each flex 114, 116 to driver 112. Each flex 114, 116 also can have board-to-board connector 122, 124 for operatively coupling each flex to a circuit board (not shown) of the electronic device.

FIGS. 7A-7C illustrate a staggered wire pattern in accordance with one embodiment of the present invention. Flex 130 can be configured to be operatively coupled to side-connecting flex-to-driver fan-out 139. That is, side-connecting flex-to-driver fan-out 139 can have at least one wire that emanates from flex 130 in a direction that is not parallel to the longitudinal axis L2 or co-linear with the wires of flex 130 at or near the regions in which fan-out 139 connects to flex 130. For example, fan-out 139 can have at least one wire that emanates from flex 130 in an orthogonal direction.

Flex 130 can include a substrate on which a set of wires 132, 134 are disposed, directly or indirectly. Each wire 132, 134 can have at least two termination regions, one disposed at one end of flex 130 and another disposed at the other end of flex 130. One or more electrical contacts can be positioned at each termination region, as discussed in greater detail below with respect to FIGS. 9B-9D. The electrical contacts can operatively couple flex 130 to other electrical components, e.g., the wires of a flex-to-driver fan-out or another circuit board, either directly or indirectly.

FIGS. 7A-7C illustrate the end of flex 130 that is configured for coupling to pixel activation substrate 136 of a display assembly. Wires 134 of flex 130 can have electrical contacts disposed in a staggered configuration, whereas wires 132 of flex 130 can have electrical contacts disposed in a non-staggered configuration.

Substrate 136 can have flex-to-driver fan-out 139 with wires disposed in a pattern that complements wires 132, 134 of flex 130. That is, the electrical contacts of flex-to-driver fan-out 139 can be disposed on substrate 136 in positions that complement the positions at which the electrical contacts of wires 132, 134 are disposed. For example, the electrical contacts of wires 142 of flex-to-driver fan-out 139 can be disposed in a complementary staggered configuration, whereas the electrical contacts of wires 140 of the fan-out can be disposed in a complementary non-staggered configuration. Electrical contacts disposed at the other ends or termination regions of wires 140, 142 can be operatively coupled to electrical contacts on driver 138.

Advantageously, the staggered configurations of wires 134, 142 can facilitate connection of a flex to a fan-out when the wires of the fan-out are not disposed co-linearly with the wires of the flex near the regions in which the two components connect. For example, as shown in FIGS. 7A-7C, the staggered configurations can facilitate connection of a flex having wires that are disposed orthogonal to the wires of flex-to-driver fan-out 139. While FIGS. 7A-7C illustrate flex 130 and flex-to-driver fan-out 139 as having wires with electrical contacts disposed in both staggered and non-staggered configurations, flex 130 and flex-to-driver fan-out 139 also can have wire electrical contacts that are disposed only in staggered configurations.

Figure 8:
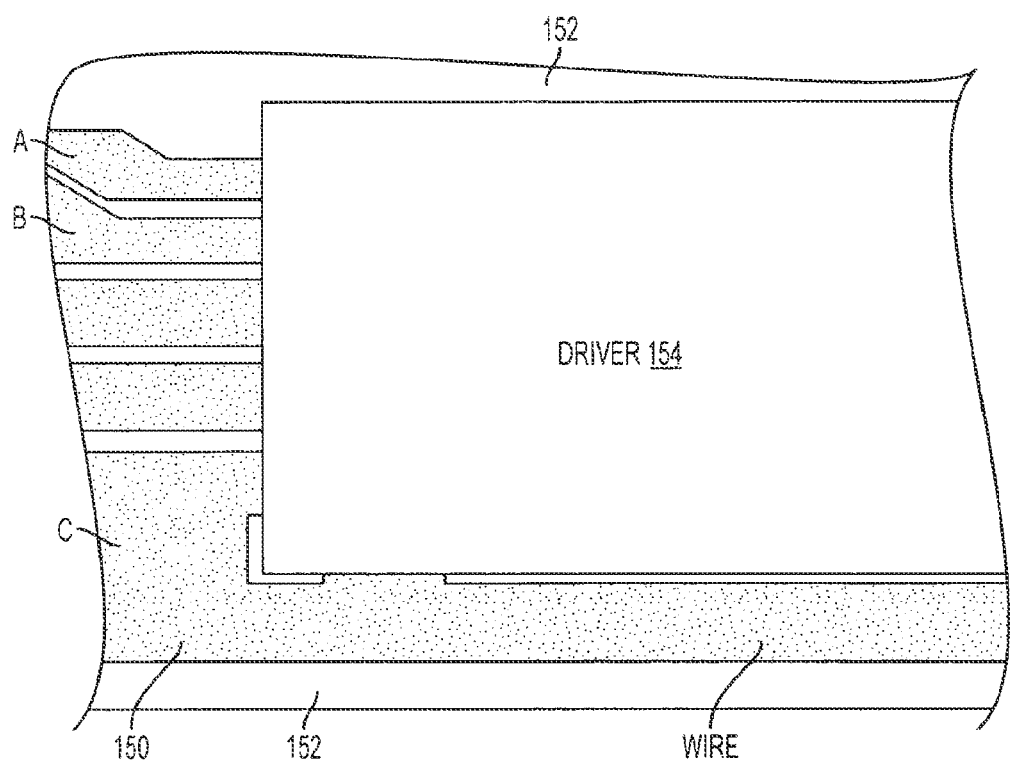
FIG. 8 illustrates a wire pattern in accordance with one embodiment of the present invention.

FIG. 8 illustrates a wire pattern in accordance with one embodiment of the present invention. Fan-out 150 can include wires designed to accommodate (1) the maximum specified impedance for the signals transmitted through the wires, and (2) the surface area available for disposition of fan-out 150 on pixel activation substrate 152. To accommodate these factors, the wires of fan-out 150 can have widths that vary from wire to wire and/or that vary along the same wire.

The resistance of a wire can be determined based on the following equation:

$$R = \frac{\rho L}{A} \quad \text{EQ. 1}$$

where $\rho$ represents the resistivity of the wire material, L is the length of the wire, and A is the cross-sectional area of the wire. Thus, by varying any one of these variables, e.g., the length or cross-sectional area of a wire, the resistance of the wire also can be varied.

As shown in FIG. 8, fan-out 150 can include wires having widths that vary from wire to wire. It may be desirable to design wires to be of narrower widths when the signals transmitted on the wires do not need to travel a long distance from a flex to driver 154 and/or the narrower widths can still accommodate the maximum specified impedances of the signals transmitted along the wires. Similarly, it may be desirable to design wires to be of wider widths when the signals transmitted on the wires need to travel a long distance from the flex to the driver and/or the wider widths are needed to accommodate the maximum specified impedances of the signals transmitted along the wires. Since one or more embodiments of the present invention can include flex-to-driver fan-out wires having variable lengths, the wires of those embodiments can have widths that vary from wire to wire.

Also shown in FIG. 8, fan-out 150 can include wires having widths that vary along the same wire. For example, each wire A-C has a width that varies along the length of the wire. When there is more space available on substrate 152 for the wires to be disposed, the width of wires A-C can be wider. However, when there is less space available (e.g., due to the size of driver 154 or the layout of components on substrate 152), the width of the wires can be reduced. Advantageously, the resulting variable width wires can have smaller effective resistances than those of wires having a constant width limited by the space available at only certain portions of the wires.

Figure 9C:
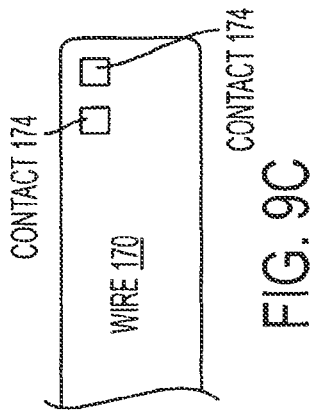
FIGS. 9B-9D show illustrative composite wires in accordance with one or more embodiments of the present invention.
Figure 9D:
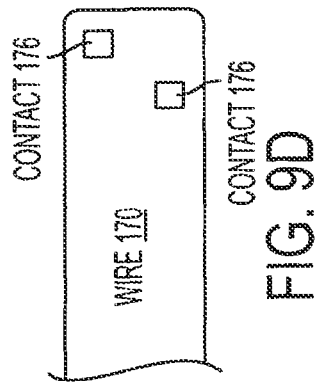
Figure 9A:
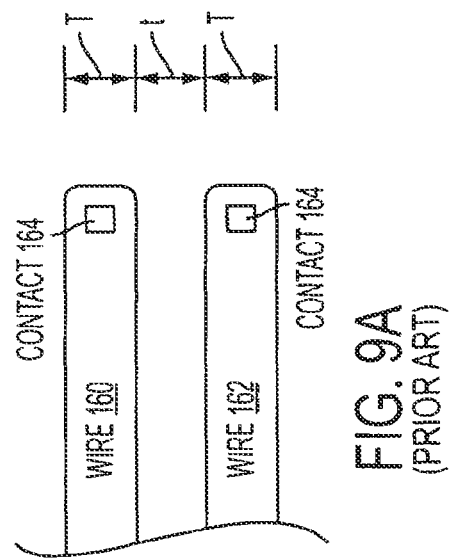
FIG. 9A illustrates prior art wires used in conventional flex and driver sub-assemblies.

FIG. 9A illustrates prior art wires used in conventional flex and driver sub-assemblies, such as sub-assembly 10 of FIGS. 1A-1B. Each of prior art wires 160, 162 can have electrical contact 164, 166 disposed at the end of the wire for coupling to another electronic device. Adjacent wires 164, 166 can be separated by distance t. Typically, each wire 160, 162 can have the same nominal cross-sectional shape with the same nominal height and width T. Each wire 160, 162 also can have the same nominal length and resistivity, thereby resulting in the same nominal resistance ($R_{NOM}$). In some conventional flex and fan-out designs, both prior art wires 160, 162 may be used to transmit the same power or data signal. As described in greater detail below, however, the use of two identical wires to transmit the same signals can be less efficient than one or more embodiments of the present invention.

Figure 9B:
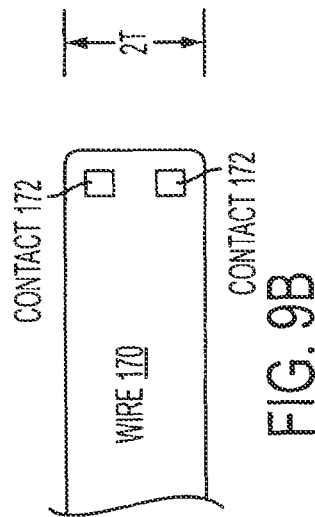

FIGS. 9B-9D show illustrative composite wires in accordance with one or more embodiments of the present invention. Composite wires 170 can be similar to prior art wires 160, 162, except that each composite wire 170 can transmit the same energy flux as multiple prior art wires 160, 162 with less resistance. For example, each composite wire 170 can have twice the width (2T) of prior art wire 160 or 162. All other factors being nominally the same, the nominal resistance of composite wire 170 can be half that of either prior art wire 160 or 162 (i.e., $R_{NOM}/2$). Furthermore, composite wire 170 can occupy less space than that occupied by prior art wires 160, 162 in total (i.e., 2T v. 2T+t). Thus, in flexes and fan-outs in which prior art wires 160, 162 are used to transmit the same power or data signal, the prior art wires can be replaced with composite wires 170 for more efficient use of space and/or for less resistance. For example, composite wire 170 can be used to transmit signals for a longer distance with less than or equal to the resistance of prior art wires 160, 162. Furthermore, because less space is occupied by composite wire 170, flexes can be narrower and less space can be occupied by fan-outs.

In the embodiments illustrated in FIGS. 9B-9D, each composite wire 170 can have multiple electrical contacts disposed at the end of each wire to emulate the electrical contacts from multiple prior art wires. Each electrical contact can be coupled to a complementary electrical contact on an electronic component, using, e.g., anisotropic conductive films. Electrical contacts 172-176 can be arranged in a side-by-side orientation as in FIG. 9B, a stacked orientation as in FIG. 9C, in a staggered orientation as in FIG. 9D, or any combination thereof.

FIG. 10 shows illustrative electronic devices in which flex and driver sub-assemblies of the present invention can be incorporated. For example, the sub-assemblies of the present invention can be incorporated in media player/recorder 130, cellular telephone 140, touch-sensitive electronic device 150, or any combination thereof. Media player/recorder 130 can have a display and playback audio and visual data. One example of a media player/recorder is a portable media player similar to that sold under the trademark iPod™ by Apple Computer, Inc. of Cupertino, Calif. Touch-sensitive electronic device 150 can include electronic devices that can accept user input by sensing the touch or proximity of a user's body part, a stylus, or a digital pen through, e.g., a touch-sensitive display. Touch sensitive electronic device 150 can include, for example, personal digital assistants, hand-held gaming devices, laptop computers, or tablet PCs.

The present invention also can be incorporated in any electronic device in which a compact flex and driver sub-assembly may be desirable. For example, the electronic device can be any portable, mobile, hand-held, or miniature consumer electronic device. Illustrative electronic devices can include, but are not limited to, music players, video players, still image players, game players, other media players, music recorders, video recorders, cameras, other media recorders, radios, medical equipment, calculators, cellular phones, other wireless communication devices, personal digital assistants, programmable remote controls, pagers, laptop computers, printers, or any combination thereof. Miniature electronic devices may have a form factor that is smaller than that of hand-held devices. Illustrative miniature electronic devices can include, but are not limited to, watches, rings, necklaces, belts, accessories for belts, headsets, accessories for shoes, virtual reality devices, other wearable electronics, accessories for sporting equipment, accessories for fitness equipment, key chains, or any combination thereof.

Although particular embodiments of the present invention have been described above in detail, it will be understood that this description is merely for purposes of illustration. Alternative embodiments of those described hereinabove also are within the scope of the present invention.

Combinations of the above-described embodiments of the present invention or portions thereof may be provided in one electronic device unit. For example, while FIG. 3 illustrates a display assembly having wires routed underneath the display driver, other embodiments of the present invention, such as the assemblies of FIGS. 2A-2B, also can have similarly routed wires.

While the above described embodiments have illustrated the flex and driver sub-assemblies of the present invention in the context of display assemblies, the principles of the present invention also can be applied to flex and driver sub-assemblies in any device or context.

The above described embodiments of the present invention are presented for purposes of illustration and not of limitation, and the present invention is limited only by the claims which follow.

What is claimed is:

1. An assembly for operatively coupling a flexible circuit to a driver, the assembly comprising:
    a substrate for attachment of the flexible circuit and the driver, the substrate having a substrate edge;
    a flexible circuit having multiple edges and at least partially covering a portion of the substrate edge, the flexible circuit attached to the substrate;
    a first set of wires emanating from a first edge of the flexible circuit, the first set of wires disposed on the substrate for operatively coupling the flexible circuit to the driver;
    a second set of wires emanating from a second edge of the flexible circuit, the second set of wires disposed on the substrate for operatively coupling the flexible circuit to the driver, wherein at least a portion of a first wire of the first set of wires is disposed on the substrate in a two-dimensional pattern, such that the first wire has a non-linear configuration, wherein at least a portion of the flexible circuit is positioned in-line with a longitudinal axis of the driver, and wherein the width of the flexible circuit is less than the width of the driver.

2. The assembly of claim 1, wherein a second wire of the first set of wires has multiple electrical contacts positioned on a termination region of the second wire.

3. The assembly of claim 1, wherein a second wire of the first set of wires has a variable width along its length.

4. The assembly of claim 3, wherein at least a portion of a first wire of the second set of wires is disposed on the substrate in a two-dimensional pattern with a non-linear configuration.

5. The assembly of claim 1, wherein the first wire has a width that is different than that of a second wire of the first set of wires.

6. The assembly of claim 1, wherein the assembly has a form factor suitable for incorporation within a hand-held electronic device.

7. The assembly of claim 1, wherein the substrate comprises a substrate suitable for electronic displays.

8. A method for manufacturing an assembly with a driver, the method comprising:
    providing a substrate, the substrate having a substrate edge;
    providing a flexible circuit having multiple edges and at least partially covering a portion of the substrate edge, the flexible circuit coupled to the substrate;
    disposing a first wire on the substrate emanating from a first edge of the flexible circuit for operatively coupling a flexible circuit to the driver, wherein at least a portion of the first wire is disposed on the substrate in a two-dimensional pattern, such that the first wire has a non-linear configuration; and
    disposing a second wire on the substrate emanating from a second edge of the flexible circuit for operatively coupling a flexible circuit to the driver, wherein at least a portion of the second wire is disposed on the substrate in a two-dimensional pattern, such that the second wire has a non-linear configuration, and wherein a portion of the flexible circuit is positioned in-line with a longitudinal axis of the driver.

9. The method of claim 8, wherein the width of the flexible circuit is less than the width of the driver.

10. The method of claim 8, wherein the second wire has a variable width along its length.

11. The method of claim 8, wherein the second wire has a width that is different than that of the first wire.

12. Display circuitry for operatively coupling a flexible circuit to a driver and for operatively coupling the driver to pixel activation components, the display circuitry comprising:
- a substrate for attachment of the flexible circuit, the driver, and the pixel activation components;
- a first set of wires disposed on the substrate for operatively coupling the flexible circuit to the driver, the first set of wires emanating from a first edge of the flexible circuit; and
- a second set of wires disposed on the substrate for operatively coupling the flexible circuit to the driver, the second set of wires emanating from a second edge of the flexible circuit, wherein the substrate has an area to be completely covered by the driver, wherein at least a portion of a first wire of the first set of wires is disposed in the area, and wherein the width of the flexible circuit is less than the width of the driver.

13. The display circuitry of claim 12, wherein the first and second set of wires have non-linear configurations.

14. Display circuitry for operatively coupling a flexible circuit to a driver, the circuitry comprising:
- a substrate for attachment of the flexible circuit and the driver;
- a first set of wires disposed on the substrate for operatively coupling the flexible circuit to the driver, wherein the first set of wires emanates from a first edge of the flexible circuit; and
- a second set of wires disposed on the substrate for operatively coupling the flexible circuit to the driver, wherein the second set of wires emanates from a second edge of the flexible circuit, and wherein the substrate has an area to be completely covered by the driver, and wherein at least a portion of a first wire of the first set of wires is disposed in the area.

15. The display circuitry of claim 14, wherein at least one of the first set of wires is disposed on the substrate in a non-linear configuration.

* * * * *